(12) United States Patent
Zwerg

(10) Patent No.: US 12,222,747 B2
(45) Date of Patent: Feb. 11, 2025

(54) METHODS AND APPARATUS TO FACILITATE SAFE STARTUP OF A POWER MANAGEMENT UNIT

(71) Applicant: Texas Instruments Incorporated, Dallas, TX (US)

(72) Inventor: Michael Zwerg, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 18/129,674

(22) Filed: Mar. 31, 2023

(65) Prior Publication Data

US 2023/0315142 A1 Oct. 5, 2023

Related U.S. Application Data

(60) Provisional application No. 63/326,303, filed on Apr. 1, 2022.

(51) Int. Cl.
*G06F 1/00* (2006.01)
*G06F 1/08* (2006.01)
*G06F 1/10* (2006.01)

(52) U.S. Cl.
CPC . *G06F 1/08* (2013.01); *G06F 1/10* (2013.01)

(58) Field of Classification Search
CPC ..... G06F 1/08; G06F 1/10; G06F 1/24; G06F 1/26; H03K 17/22
See application file for complete search history.

(56) References Cited

U.S. PATENT DOCUMENTS

| 5,528,166 | A  | * | 6/1996  | Iikbahar | H03K 17/164 |
|           |    |   |         |          | 326/27 |
| 9,515,637 | B1 | * | 12/2016 | Schnaitter | H03K 5/24 |
| 2004/0120149 | A1 | * | 6/2004 | Hu | H04N 9/3144 |
|           |    |   |         |          | 362/276 |
| 2012/0069608 | A1 | * | 3/2012 | Yang | H02M 3/33507 |
|           |    |   |         |          | 363/21.12 |
| 2016/0191041 | A1 | * | 6/2016 | Chung | G05F 1/463 |
|           |    |   |         |          | 327/143 |
| 2018/0076810 | A1 | * | 3/2018 | Hietala | H03K 17/223 |
| 2019/0033902 | A1 | * | 1/2019 | Enjalbert | G05F 1/575 |
| 2021/0004032 | A1 | * | 1/2021 | Mozipo | H03K 17/22 |

* cited by examiner

*Primary Examiner* — Xuxing Chen
(74) *Attorney, Agent, or Firm* — Brian D. Graham; Frank D. Cimino

(57) ABSTRACT

An example apparatus includes an input terminal; an output terminal; a delay circuit including an input terminal and an output terminal, the input terminal coupled of the delay circuit coupled to the input terminal; a comparator including a first input terminal, a second input terminal, and an output terminal, the first input terminal of the comparator coupled to a supply voltage terminal, the second input terminal of the comparator coupled to a reference voltage terminal; and a logic AND gate including a first input terminal, a second input terminal, a third input terminal, and an output terminal, the first input terminal of the logic AND gate coupled to the output terminal of the comparator, the second input terminal of the logic AND gate coupled to the output terminal of the delay circuit, the third input terminal of the logic AND gate coupled to the input terminal, and the output terminal of the logic AND gate coupled to the output terminal.

20 Claims, 7 Drawing Sheets

METHODS AND APPARATUS TO FACILITATE SAFE STARTUP OF A POWER MANAGEMENT UNIT

RELATED APPLICATION

This patent claims the benefit of and priority to U.S. Provisional Patent Application No. 63/326,303, which was filed on Apr. 1, 2022, which is incorporated herein by reference in its entirety.

TECHNICAL FIELD

This description relates generally to integrated circuitry, and more particularly to methods and apparatus to facilitate safe startup of a power management unit.

BACKGROUND

Some integrated circuits (ICs) include a power management unit (PMU). A PMU controls the power function of digital platforms on the IC. A PMU may include hardware, software, and/or firmware to measure and/or regulate external power sources. A PMU may monitor power connection, battery charges, perform battery charging protocols, control and/or regulate power to one or more components of an IC, show down idle components, control sleep operations, regulate a real-time clock, etc.

SUMMARY

For facilitation of a safe startup of a power management unit, an example apparatus includes an input terminal: an output terminal: a delay circuit including an input terminal and an output terminal, the input terminal coupled of the delay circuit coupled to the input terminal; a comparator including a first input terminal, a second input terminal, and an output terminal, the first input terminal of the comparator coupled to a supply voltage terminal, the second input terminal of the comparator coupled to a reference voltage terminal; and a logic AND gate including a first input terminal, a second input terminal, a third input terminal, and an output terminal, the first input terminal of the logic AND gate coupled to the output terminal of the comparator, the second input terminal of the logic AND gate coupled to the output terminal of the delay circuit, the third input terminal of the logic AND gate coupled to the input terminal, and the output terminal of the logic AND gate coupled to the output terminal.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
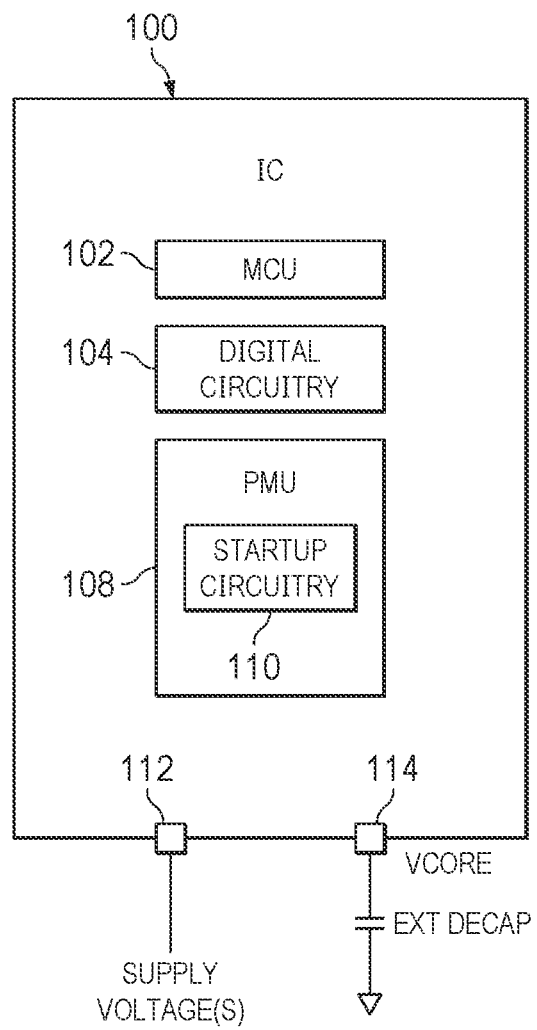
FIG. 1 is a block diagram of an example integrated circuit described in conjunction with examples disclosed herein.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

An integrated circuit (IC) (also referred to as a chip or microchip) is a group of circuits on semiconductor material. A system on a chip (SoC), a microcontroller unit (MCU), etc. are types of ICs. In some examples, an IC may utilize several controlled voltage levels to operate. For example, an external supply voltage may be higher than what can be tolerated by digital logic gates in a high density IC. ICs may include a power management unit (PMU) to step down the external supply voltage to generate a sub-regulated voltage supply to the IC. The sub-regulated voltage supply can be tolerated by the digital logic gates.

Startup of a PMU may include multiple challenges that make standard circuit startup techniques difficult to implement safely. For example, digital logic may correspond to a certain minimum voltage level to operate. However, the initial external power supply may start at a zero-voltage level, thereby corresponding to a zero-voltage digital logic, and, at this point in time, the supplied voltage is not sufficient to power digital logic in the PMU. As another example, for safe and controlled startup of the PMU, some ICs utilize a startup finite state machine and/or startup controller to address failure modes until the external voltage supply is stable and above a threshold voltage. Failure modes may be caused by a fluctuating power supply (e.g., corresponding to an unexpected voltage drop and/or rise during the startup period), IC internal exceptions that correspond to a restart of a startup sequence, etc. However, such a startup finite state machine and/or startup controller may rely on a clock and/or oscillator for sequencing. However, the clock and/or oscillator may only become active after the PMU has provided a safe power source to operate and indicated that the power source is ready to be used. Accordingly, the PMU relies on the clock to determine when the external power source is safe, but the clock may not be properly working until the external power source is safe, which the PMU is structured to determine.

Examples disclosed herein sequences a safe startup of a PMU asynchronously without a clock. Examples disclosed herein provide circuitry including analog and digital components to provide a controlled startup sequence of the PMU without relying on a clock. In this manner, the PMU can power the clock and other circuitry (e.g., a MCU, a CPU, etc.) after the external power supply is stable and above a threshold voltage. The analog components include an enable input and an okay-status output. The enable input controls the startup of the analog component and the okay-status output indicates when the analog component is functional. Examples disclosed herein can use the enable input and okay output as a timing element to sequence the startup for determining when the supply voltage is stable. The okay-status output of one analog component is used as the enable input of a second analog component to facilitate a string of analog components that are enabled in order until the PMU is fully functional. The digital components may be used to guide the self-timed sequence and to deal with the IC external exceptions.

Because examples disclosed herein facilitate a startup sequence (e.g., startup process, startup protocol, a bot process, a boot protocol, etc.) of a PMU without reliance on a clock and/or oscillator, examples disclosed herein provide a solution to utilizing timing information from components that may be operating outside of normal operating voltages. Thus, examples disclosed herein may include features to avoid glitches in the powerup sequence caused by power spikes and/or drops that cause conventional startup circuitry to operate in an undefined state. As used herein, a startup process may be referred to as a boot process, a cold boot process, an enable process, etc.

FIG. 1 is a block diagram of an example integrated circuit (IC) 100. However, the IC 100 may be a microcontroller unit and/or any other circuitry. The example IC 100 of FIG. 1 includes an example MCU 102, digital circuitry 104, an example PMU 108, example startup circuitry 110, an example external supply voltage (VDDS and/or VDDA) terminal(s) 112, and an example core voltage (Vcore or VCORE) terminal 113. The IC 100 of FIG. 2 may be a SoC, a MCU, and/or any other type of IC.

The example MCU 102 of FIG. 1 includes components to control one or more functions of the IC 100. The MCU 102 may include input outputs (IO), memory, processor cores, a central processing unit (CPU), etc. In some examples, the MCU 102 can be replaced with a CPU. The MCU 102 includes circuitry to run applications and/or execute instructions of a program. The instructions may include logic, control, arithmetic input/output operation, etc. The MCU 102 is powered by a regulator of the PMU 108 that is based on the supply voltage received at the supply voltage terminal 112. For example, the supply voltage may correspond to a voltage that is too high for the components (e.g., digital components) of the MCU 102, digital circuitry 104 to tolerate. Thus, the regulator of the PMU 108 reduces the supply voltage to a voltage within an acceptable range for the MCU 102 and/or digital circuitry 104.

The digital circuitry 104 of FIG. 1 is digital circuitry. The digital circuitry 104 may include a clock that includes a system oscillator. The different components of the IC 100 may use the clock for any time-dependent functionalities. As further described below, during startup the supply voltage may not be stable, which may cause the clock to be inaccurate. Thus, the startup circuitry 110 determines (e.g., without the use of the clock) when the supply voltage is substantially stable before enabling the clock. Additionally, the digital circuitry 104 may include a system control shutdown finite state machine (or other shutdown circuitry) to cause the IC 100 to partially shutdown and/or go into a sleep mode.

The PMU 108 of FIG. 1 controls power functions of digital platforms (E.g., the digital components) on the IC 100. As described above, during startup, the supply voltage(s) (e.g., obtained via the supply voltage terminal 112), may start at zero volts and/or may include spikes and/or drops before stabilizing. Thus, the PMU 108 includes the example startup circuitry 110 to determine when the supply voltage is both stable and is within the operating range to power a remainder of the IC 100.

The startup circuitry 110 of FIG. 1 includes analog and digital components to determine when a supply voltage is sufficiently high and/or stable to enable a clock and/or power the digital components on the IC 100. As described above, during startup the supply voltage may not be high enough and/or stable enough to power the clock without causing inaccuracy in the timing information output by the clock. Accordingly, the startup circuitry 110 determines when the supply voltage is above one or more thresholds and/or stable enough to enable the clock without use of the clock to provide timing information. The startup circuitry 110 includes circuitry to facilitate the shutdown and/or sleep of one or more components of the IC 100 and/or perform a force power on reset. The startup circuitry 110 is further described below in conjunction with FIGS. 2-4.

Figure 2:
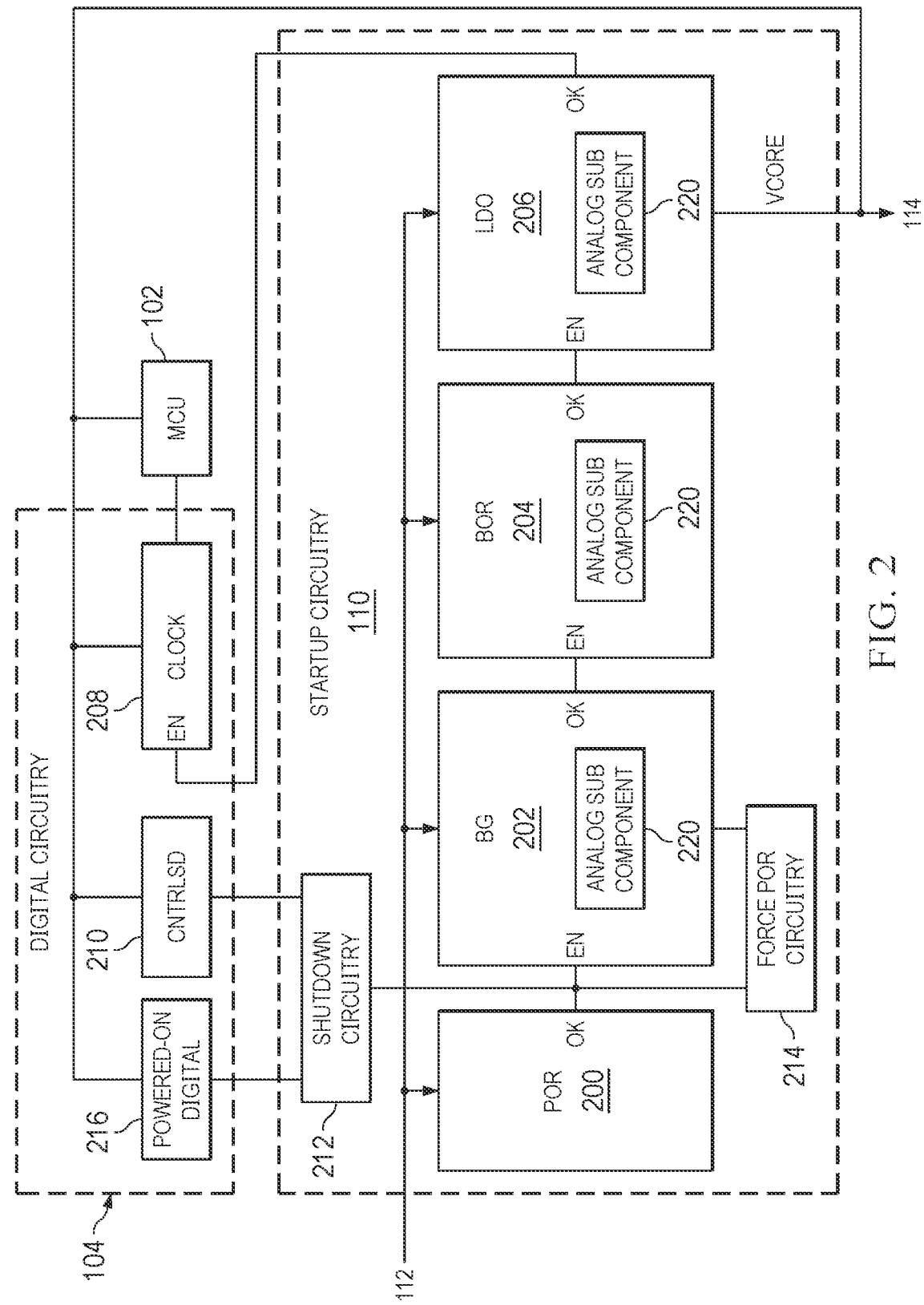
FIG. 2 is a block diagram of the example startup circuitry implemented in the power management unit of FIG. 1.

FIG. 2 is a block diagram of the digital circuitry 104 and the startup circuitry 110 of FIG. 1. The example startup circuitry 110 includes example power on reset (POR) circuitry 200, example bandgap reference (BG, REF, and/or BG REF) circuitry 202, example brown out reset (BOR) circuitry 204, an example regulator 206, example force power on reset (POR) circuitry 214, and example shutdown circuitry 212. Each of the example circuitry 202, 204, and 206 includes an example analog sub component 220 (also referred to as a voltage measurement circuit). The example digital circuitry 104 includes example control shutdown circuitry 210, an example clock generator 208 and example powered-on (PO) digital circuitry 216. FIG. 2 further includes the MCU 102 of FIG. 1.

The example POR circuitry 200 of FIG. 2 is threshold voltage-based circuitry with a threshold that can vary from, for example, 0.9 V to 1.3 V. During startup, after a supply voltage is first applied via the supply voltage terminal 112, the POR circuitry 200 outputs a logic high signal to the bandgap reference circuitry 202 when the supply voltage is above a first threshold voltage (e.g., 1 volt (V)) to enable the bandgap reference circuitry 202. As used herein a high logic signal or value corresponds to a voltage above one or more thresholds (e.g., 1 V, 1.3 V, 3 V, etc.) and a low logic signal or value corresponds to no voltage, 0 V, or voltage below the one or more thresholds.

The bandgap reference circuitry 202 of FIG. 2 is a temperature independent voltage reference circuit. The bandgap reference circuitry 202 includes the example analog sub component 220 to, after the input signal from the POR circuitry 200 is a logic high value, generate an output logic high value when (a) the supply voltage is above a second threshold (e.g., 1.3 V) and (b) after the input signal from the POR circuitry 200 has maintained the logic high value for a threshold amount of time. The analog sub component 220 of the BG circuitry 202 outputs the logic high value to the BOR circuitry 204 to enable the BOR circuitry 204. The example analog sub component 220 is further described below in conjunction with FIG. 4.

The example BOR circuitry 204 of FIG. 2 protects from voltage drops below the brown out threshold voltage, as further described below in conjunction with FIGS. 3A and 3B. Additionally, the BOR circuitry 204 includes the analog sub component 220 to, after the input signal from the BG circuitry 202 is a logic high value, generate an output logic high value when (a) the supply voltage is above a third threshold (e.g., 1.6 V) and (b) after the input signal from the BG circuitry 202 has maintained the logic high value for a threshold amount of time. The analog sub component 220 of the BOR circuitry 204 outputs the logic high value to the regulator 206 to enable the regulator 206. The example analog sub component 220 is further described below in conjunction with FIG. 4.

The regulator 206 of FIG. 2 is a low dropout (LDO) regulator. However, the regulator 206 can be any type of regulator. The example regulator 206 regulates the supply voltage from the supply voltage terminal 112 to an output voltage (e.g., at the output voltage terminal 114) within an acceptable range for the MCU 102 and/or digital circuitry 104. Additionally, the example regulator 206 includes the analog sub component 220 to, after the input signal from the BOR circuitry 204 is a logic high value, generate an output logic high value when the output voltage (e.g., VCORE) is stable at a predefined voltage (e.g., 1.35 V) and (b) after the input signal from the BOR circuitry 204 has maintained the logic high value for a threshold amount of time. The analog sub component 220 of the regulator 206 outputs the logic high value to the clock generator 208 to enable the clock generator 208. In some examples, the regulator 206 may be replaced with a regulator and a regulator comparator that implements the analog sub component 220 (e.g., as illustrated by 206A and 206B of FIGS. 3A and 3B). For example, a first regulator (e.g., 206B of FIGS. 3A and 3B) can generate the output voltage (e.g., VCORE) at the output terminal 114 and generate a logic high input after the first regulator has regulated the supply voltage to the desired output voltage. However, because the output of the first regulator is coupled to the output voltage terminal, and the output voltage terminal is connected to an external capacitor, the voltage at the output terminal of the first regulator may take time to reach the output voltage (e.g., corresponding to an amount of time to charge the external capacitor). Accordingly, the regulator 206 may include a second regulator comparator (e.g., 206A of FIGS. 3A and 3B) that implements the analog sub component 220 to obtain output voltage (e.g., VCORE) generated by the first regulator via a connection to the first regulator at the output voltage terminal 114. The second regulator comparator compares the output voltage to a threshold to determine that the output voltage is stable at the predefined voltage (e.g., as further described below in conjunction with FIGS. 3A and 3B). In such an example, the clock generator 208 may not be enabled until both the first regulator and the second regulator comparator output a logic high value, as further described below.

The digital circuitry 104 of FIG. 2 includes the example clock generator 208 to generate voltage pulses at a predefined frequency when enabled. The example clock generator 208 remains disabled until the regulator 206 transmits a logic high value to the clock generator 208. As described above, the MCU 102 and/or other components of the IC 100 can use the clock for any function that corresponds to time. The digital circuitry 104 further includes control shutdown circuitry 210. The control shutdown circuitry 210 transmits a signal to the example shutdown circuitry 212 to cause the input signal to the BG circuitry 202 to go to a logic low value, thereby disabling the BG circuitry 202, the BOR circuitry 204, and the regulator 206 to stop providing power to one or more components of the IC 100. For example, because the regulator 206 powers the digital circuitry 104, disabling the regulator 206 disables the clock generator 208. After the shutdown circuitry 212 disables the BG circuitry 202, the BOR circuitry 204, and the regulator 206, the components of the PMU 108 can be reenabled with a subsequent wakeup signal. Although the shutdown circuitry 212 disables the BG circuitry 202, the BOR circuitry 204, and the regulator 206, the shutdown circuitry 212 may not disable the POR circuitry 200. In this manner, the POR circuitry 200 can provide power to the PO digital circuitry 216 via the logic gate 300 (e.g., the output voltage of the logic gate 300 when the output of the flip-flop 334 is a low voltage when force POR protocol is not occurring). The PO digital circuitry 216 may include components (e.g., trimming circuitry, particular flip-flops, shut-down memory, etc.) that a user and/or manufacturer may desire to keep powered even when the other components are disabled. The shutdown circuitry 212 is further described below in conjunction with FIGS. 3A and 3B.

The example force POR circuitry 214 of FIG. 2 provides the ability to reset the BG circuitry 202, the BOR circuitry 204, and the regulator 206 by outputting a logic low to the BG circuitry 202. Outputting a logic low signal to the BG circuitry 202 disables the BG circuitry 202 which causes the BG circuitry 202 to output the logic low to the BOR circuitry 204, thereby disabling the BOR circuitry 204 which causes the BOR circuitry 204 to output the logic low value to the regulator 206, thereby disabling the regulator 206. As opposed to disabling the BG circuitry 202, the BOR circuitry 204, and the regulator 206 until a wakeup signal is obtained (e.g., corresponding to operation of the shutdown circuitry 212), the force POR circuitry 214 only temporarily disables the BG circuitry 202, the BOR circuitry 204, and the regulator 206 and re-enables the BG circuitry 202, the BOR circuitry 204, and the regulator 206 after a threshold amount of time (e.g., without requiring a wakeup signal). The automatic re-enabling of the BG circuitry 202, the BOR circuitry 204, and the regulator 206 is triggered by a delayed output signal (e.g., a REF_EN_DLY output) from the BG circuitry 202, as further described below in conjunction with FIGS. 3A and 3B. A reset operation may be used in response to a brown out event (e.g., a supply voltage drop below a threshold), a software request to perform POR (e.g., from the MCU 102), and/or another trigger based on user and/or manufacturer preferences. The force POR circuitry 214 is further described below in conjunction with FIGS. 3A and 3B.

Figure 3A:
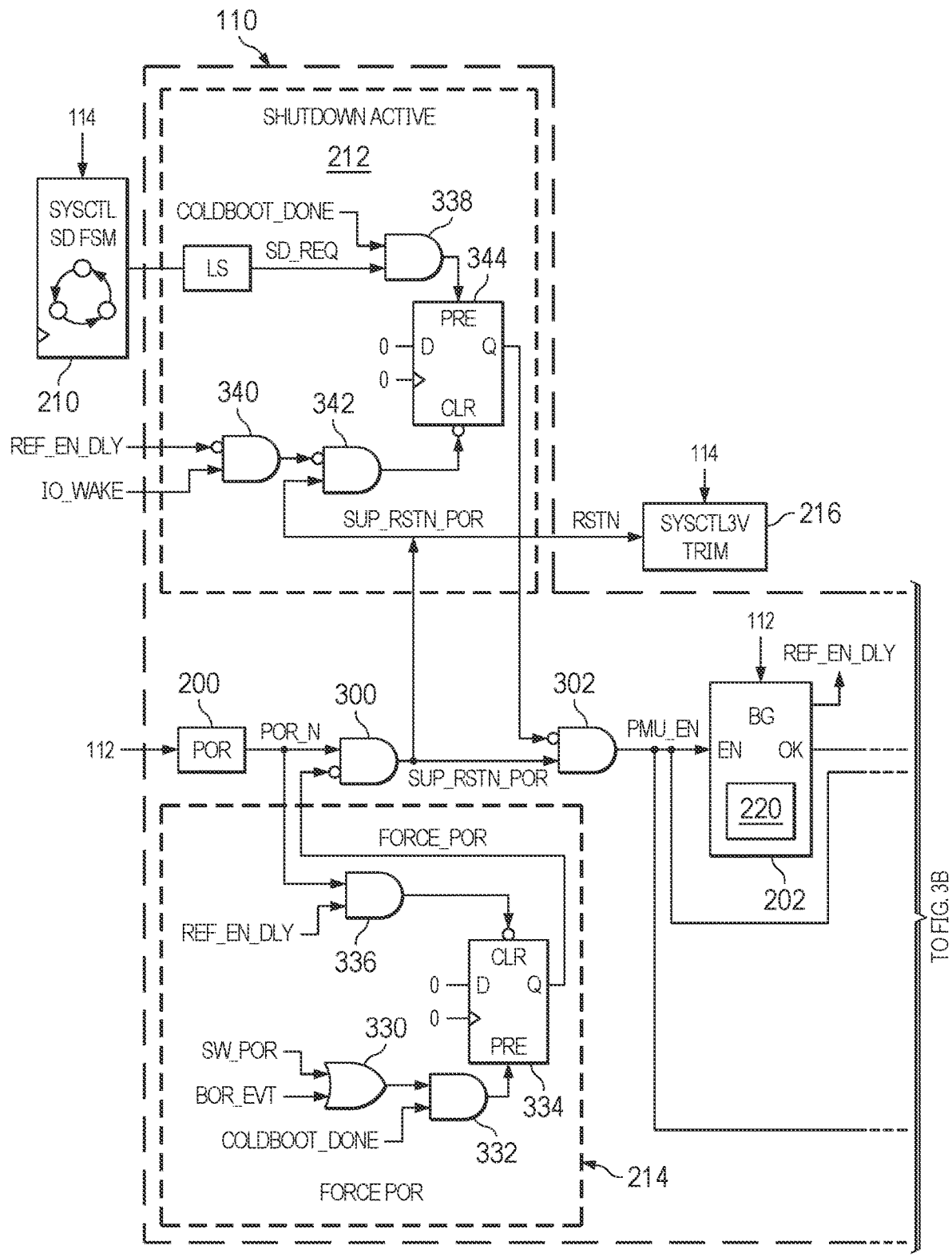
FIGS. 3A and 3B illustrate a circuit diagram of the example startup circuitry of FIGS. 1 and/or 2.

FIGS. 3A and 4B illustrate a circuit diagram of an example implementation of the startup circuitry 110 of FIGS. 1 and/or 2. FIGS. 3A and 3B include the POR circuitry 200, the BG circuitry 202, the BOR circuitry 204, the regulator(s) 206 (e.g., a regulator comparator 206A and a regulator 206B), the clock generator 208, the system shut down (SD) circuitry 210, the SD circuitry 212, the force POR circuitry 214, the PO digital circuitry 216, and the analog sub components 220 of FIG. 2. FIG. 2 further includes example logic gates 300, 302, 304, 306, 308, 310, 312, 314, 316, 320, 326, 330, 332, 336, 338, 340, 342, 348, example flip-flops 318, 322, 334, 344, and an example comparator 346.

The below description of FIGS. 3A and 3B first includes a structural description of FIGS. 3A and 3B followed by a functional description of FIGS. 3A and 3B.

The example POR circuitry 200 includes an input terminal and an output terminal. The input terminal of the POR circuitry 200 is coupled to the supply voltage terminal 112 of FIG. 1. The output terminal (e.g., POR_N) of the POR circuitry 200 is coupled to a first input terminal of the logic gate 300 and the first input terminal of the logic gate 336. As further described below, the POR circuitry 200 outputs a logic high value when the supply voltage at the supply terminal 112 is above a first threshold and outputs a logic low value when the supply voltage is below the first threshold.

The example logic gate 300 is an AND logic gate. The logic gate 300 includes two input terminals and an output terminal. The first input terminal of the logic gate 300 is coupled to the output terminal (e.g., POR_N) of the POR circuitry 200 and the input terminal of the logic gate 336. The second input terminal of the logic gate 300 is coupled to an output terminal (e.g., FORCE_POR, further described below) of the flip-flop 334. The second input terminal of the logic gate 300 is an inverted input terminal, where the value at the second input is inverted (e.g., from a logic high value to a logic low value or a low value to a high value). Alternatively, the input terminal may not be inverted and a not gate or an inverter may be coupled in between the second input of the logic gate 300 and an output of the flip-flop 334. The output terminal (e.g., SUP_RSTN_POR) of the logic gate 300 is coupled to a second input terminal of the logic gate 302, a second input terminal of the logic gate 342, and the PO digital circuitry 216. As further described below, the logic gate 300 performs a logic AND function to output a logic high value when the first input is a logic high and the second input is a logic low (which is inverted to a logic high via the inverted terminal). Otherwise, the logic gate 300 outputs a logic low value.

The example logic gate 302 is an AND logic gate. The logic gate 302 includes two input terminals and an output terminal. The first input terminal of the logic gate 302 is coupled to an output terminal of the flip-flop 344. The first terminal is an inverted input terminal, where the value at the first input is inverted (e.g., from a logic high value to a logic low value or a low value to a high value). Alternatively, the input terminal may not be inverted and a not gate or an inverter may be coupled in between the first input of the logic gate 302 and an output of the flip-flop 344. The second input terminal is coupled to the output terminal of the logic gate 300, the second input terminal of the logic gate 342, and the PO digital circuitry 216. The output terminal (PMU_EN) of the logic gate 302 is coupled to the clear terminals of the flip-flops 318, 322, an enable terminal of the BG circuitry 202, and a second input terminal of the logic gate 304. As further described below, the logic gate 302 performs a logic AND function to output a logic high value when the first input is a logic low (which is inverted to a logic high via the inverted terminal) and the second input is a logic high. Otherwise, the logic gate 302 outputs a logic low value.

The BG circuitry 202 includes two input terminals and two output terminals. The first input terminal of the BG circuitry 202 is coupled to the supply voltage terminal 112, the second input terminal (e.g., EN or BG_EN) of the BG circuitry 202 is coupled to the output terminal of the logic gate 203, the clear terminals of the flip-flops 318, 322, and the second input terminal of the logic gate 304. The first output terminal (e.g., REF_EN_DLY, further described below) of the BG circuitry 202 is coupled to the second input terminal of the logic gate 336 and the first input terminal of the logic gate 340. The second output terminal (e.g., OK or BG_OK) of the BG circuitry 202 is coupled to the first input of the logic gate 304. The BG circuitry 202 includes the analog sub component 220 to output a logic high value when (a) the supply voltage is above a second threshold and (b) the input logic value has been high for more than a threshold amount of time, as further described below.

The logic gate 304 is an AND logic gate. The logic gate 304 includes two input terminals and an output terminal. The first input terminal of the logic gate 304 is coupled to the second output terminal of the BG circuitry 202. The second input terminal of the logic gate 304 is coupled to the output terminal of the logic gate 302, the second input terminal of the BG circuitry 202, and the clear terminals of the flip-flops 318, 322. The output terminal (REF_OK) of the logic gate 304 is coupled to a first input of the logic gate 306. As further described below, the logic gate 304 performs a logic AND function to output a logic high value when the first input is a logic high and the second input is a logic high. Otherwise, the logic gate 304 outputs a logic low value.

The logic gate 306 is an OR logic gate. The logic gate 306 includes two input terminals and an output terminal. The first input terminal of the logic gate 306 is coupled to the output terminal of the logic gate 304. The second input terminal of the logic gate 306 is coupled to the first input terminal of the logic gate 320, the first input terminal of the logic gate 312, an output terminal of the flip-flop 318, and the input terminal of the logic gates 326. The output terminal of the logic gate 306 is coupled to the third input terminal of the BOR circuitry 204. As further described below, the logic gate 306 performs a logic OR function to output a logic high value when the first input is a logic high and/or the second input is a logic high. The logic gate 306 outputs a logic low value when both inputs are logic low.

The BOR circuitry 204 includes three input terminals and one output terminal. The first input terminal of the BOR circuitry 204 is coupled to the supply voltage terminal 112. The second input terminal (e.g., VTH) of the BOR circuitry 204 is coupled to a voltage source providing a threshold voltage and an input terminal of the comparator 346. The third input terminal (e.g., EN or BOR_EN) of the BOR circuitry 112 is coupled to the output of the logic gate 306. The output terminal (e.g., OK or BOR_OK) of the BOR circuitry 204 is coupled to a second input of the logic gate 348, a second input of the logic gate 308, and a second input of the logic gate 312. The BOR circuitry 204 includes the analog sub component 220 to output a logic high value when (a) the supply voltage is above a third threshold and (b) the input logic value has been high for more than a threshold amount of time, as further described below.

The logic gate 308 is an AND logic gate. The logic gate 308 includes two input terminals and an output terminal. The first input terminal is coupled to the output terminal (e.g., COLDBOOT_DONE, further described below) of the flip-flop 322. The first terminal is an inverted input terminal, where the value at the first input is inverted (e.g., from a logic high value to a logic low value or a low value to a high value). Alternatively, the first input terminal may not be inverted and a not gate or an inverter may be coupled in between the first input of the logic gate 308 and an output of the flip-flop 322. The second input terminal of the logic gate 308 is coupled to the second input terminal of the logic gate 348, the output terminal of the BOR circuitry 204, and the second input terminal of the logic gate 312. The output terminal of the logic gate 308 is coupled to the second input terminal of the regulator comparator 206A and the second input terminal of the logic gate 310. As further described below, the logic gate 308 performs a logic AND function to output a logic high value when the first input is a logic low (which is inverted to a logic high via the inverted terminal) and the second input is a logic high. Otherwise, the logic gate 308 outputs a logic low value.

Figure 3B:
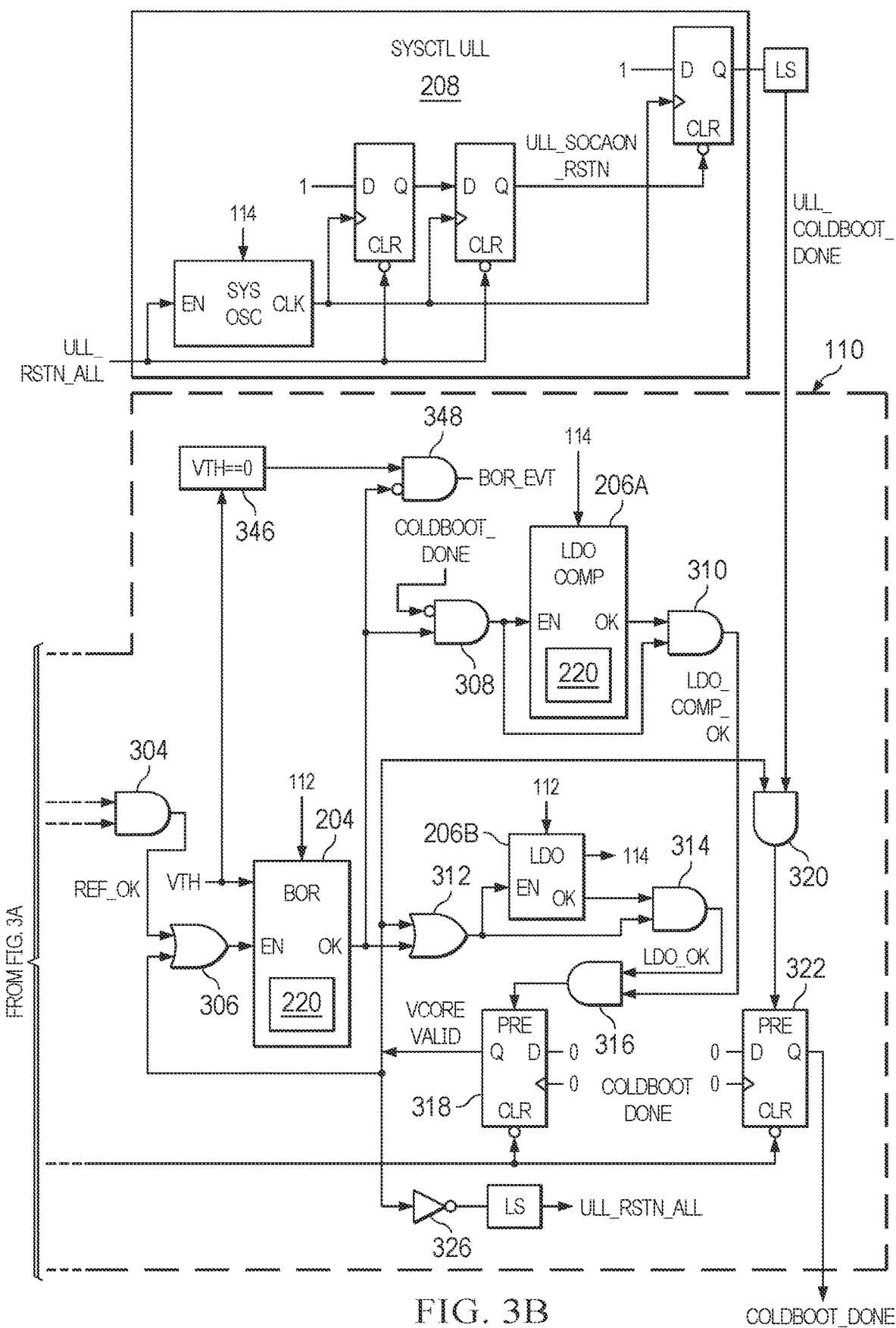

According to the example of FIGS. 3A and 3B, the regulator 206 of FIG. 2 is implemented by the example regulator comparator 206A and the example regulator 206B.

The regulator comparator 206A includes two input terminals and an output terminal. The first input terminal of the regulator comparator 206A is coupled to the first output terminal of the regulator 206B, which is the output voltage terminal 114 (VCORE terminal). The second input terminal (e.g., EN or LDO_COMP_EN) of the regulator comparator 206A is coupled to the output of the logic gate 308 and the second input terminal of the logic gate 310. The output terminal (e.g., OK) of the regulator comparator 206A is coupled to the first input of the logic gate 310. As further described below, the regulator comparator 206A includes the analog sub component 220 to output a logic high value when (a) the output voltage (VCORE) at the output terminal 114 is substantially stable and/or above a threshold voltage and (b) the input logic value has been high for more than a threshold amount of time, as further described below.

The example logic gate 310 is a logic AND gate. The logic gate 310 includes two input terminals and an output terminal. The first input terminal of the logic gate 310 is coupled to the output terminal of the regulator 206A. The second input terminal of the logic gate 310 is coupled to the output terminal of the logic gate 308 and the input of the regulator 206A. The output terminal (e.g., LDO_COMP_OK) of the logic gate 310 is coupled to the second input terminal of the logic gate 316. As further described below, the logic gate 310 performs a logic AND function to output a logic high value when the first input is a logic high and the second input is a logic high. Otherwise, the logic gate 310 outputs a logic low value.

The logic gate 312 is a logic OR gate. The logic gate 312 includes two input terminals and an output terminal. The first input terminal of the logic gate 312 is coupled to the first input terminal of the logic gate 320, the output terminal of the flip-flop 318, the second input terminal of the logic gate 306, and the input terminal of the logic gate 326. The second input terminal of the logic gate 312 is coupled to the output terminal of the BOR circuitry 204, the second input terminal of the logic gate 348 and the second input terminal of the logic gate 308. The output terminal of the logic gate 312 is coupled to the second input terminal of the regulator 206B and the second input terminal of the logic gate 314. As further described below, the logic gate 312 performs a logic OR function to output a logic high value when the first input is a logic high and/or the second input is a logic high. If both inputs are a logic low, the logic gate 312 outputs a logic low value.

The regulator 206B includes two input terminals and two output terminals. The first input terminal of the regulator 206B is coupled to the supply voltage terminal 112. The second input terminal (e.g., EN or LDO_EN) of the regulator 206B is coupled to the output of the logic gate 312 and the second input terminal of the logic gate 314. The first output terminal of the regulator 206B is coupled to the output voltage terminal (the VCORE terminal) 114. The second output terminal (e.g., OK) of the regulator 206B is coupled to the first input terminal of the logic gate 314. As further described below, the regulator 206B regulates the supply voltage from the supply voltage terminal 112 to an output voltage (VCORE) at the output voltage terminal 114. Additionally, the regulator 206B outputs a logic high to indicate that the supply voltage has been regulated to the intended output voltage.

The example logic gate 314 is a logic AND gate. The logic gate 314 includes two input terminals and one output terminal. The first input terminal of the logic gate 314 is coupled to the output terminal of the regulator 206B. The second input terminal of the logic gate 314 is coupled to the output terminal of the logic gate 312 and the second input terminal of the regulator 206B. The output terminal (e.g., LDO_OK) of the logic gate 314 is coupled to the first input terminal of the logic gate 316. As further described below, the logic gate 314 performs a logic AND function to output a logic high value when the first input is a logic high and the second input is a logic high. Otherwise, the logic gate 314 outputs a logic low value.

The logic gate 316 is a logic AND gate. The logic gate 316 includes two input terminals and an output terminal. The first input terminal of the logic gate 316 is coupled to the output terminal of the logic gate 314. The second input terminal of the logic gate 316 is coupled to the output terminal of the logic gate 310. The output terminal of the logic gate 316 is coupled to the input terminal (e.g., an asynchronous preset PRE terminal) of the flip-flop 318. As further described below, the logic gate 316 performs a logic AND function to output a logic high value when the first input is a logic high and the second input is a logic high. Otherwise, the logic gate 316 outputs a logic low value.

The flip-flop 318 is a state flip-flop and/or D flip-flop. The flip-flop 318 does not utilize a clock to control the flip-flop 318 and the data input (e.g., D) is coupled to receive a fixed logic low. The flip-flop 318 includes two asynchronous input terminals and an output terminal. The first input terminal (e.g., the PRE terminal) of the flip-flop 318 is coupled to the output of the logic gate 316. The second input terminal (e.g., an asynchronous clear CLR terminal) of the flip-flop 318 is coupled to the second input terminal of the flip-flop 322, the output terminal of the logic gate 302, the input terminal of the BG circuitry 202, and the second input terminal of the logic gate 304. The output terminal (e.g., Q) of the flip-flop 318 is coupled to the first input terminal of the logic gate 320, the second input terminal of the logic gate 306, and the input terminal of the logic gate 326. As further described below, the flip-flop 318 is a clockless flip-flop that stores and outputs the logic value obtained via the PRE input terminal and outputs the stored value until a trigger is received via the CLR input terminal.

The example logic gate 320 if a logic AND gate. The logic gate 320 includes two input terminals, and an output terminal. The first input terminal of the logic gate 320 is coupled to the output terminal of the flip-flop 318, the second input of the logic gate 306, and the input terminal of the logic gate 326. The second input terminal of the logic gate 320 is coupled to an output terminal (e.g., ULL_COLDBOOT_DONE) of the clock generator 208. The output terminal of the logic gate 320 is coupled to the input terminal of the flip-flop 322. As further described below, the logic gate 320 performs a logic AND function to output a logic high value when the first input is a logic high and the second input is a logic high. Otherwise, the logic gate 320 outputs a logic low value.

The flip-flop 322 is a state flip-flop and/or D flip-flop. The flip-flop 322 includes two asynchronous input terminals and an output terminal. The first input terminal (e.g., PRE terminal) of the flip-flop 322 is coupled to the output of the logic gate 320. The second input terminal (e.g., CLR terminal) of the flip-flop 322 is coupled to the output terminal of the flip-flop 318, the output terminal of the logic gate 302, the input terminal of the BG circuitry 202, and the second input terminal of the logic gate 304. The output terminal (e.g., COLDBOOT_DONE) of the flip-flop 322 is coupled to the first input of the logic gate 338, the second input terminal of the logic gate 332, and the first input terminal of the logic gate 308. As further described below, the flip-flop 322 is a clockless flip-flop that stores and outputs the logic value obtained via the PRE input terminal and outputs the stored value until a trigger is received via the CLR input terminal.

The logic gate 326 is a logic NOT gate and/or an inverter. The logic gate 326 includes an input terminal and an output terminal. The input terminal of the logic gate 326 is coupled to the output terminal of the flip-flop 318, the second input of the logic gate 306, the first input of the logic gate 312, and the first terminal of the logic gate 320. The output terminal (e.g., ULL_RTSN_ALL) of the logic gate 326 is coupled to the input of the clock generator 208 via the ULL_RSTN_ALL terminal and/or connection. As further described below, the logic gate 326 outputs a logic value that is the opposite (e.g., inverted) of the logic value at the input terminal.

The force POR circuitry 224 includes the logic gates 330, 332, 336 and the flip-flop 334. As further described below, the POR circuitry 224 forces a power-on reset. The logic gate 330 is a logic OR gate. The logic gate 330 includes two input terminals and one output terminal. The first input terminal (e.g., SW_POR) of the logic gate 330 is coupled to the MCU 102 to obtain software-based power on reset triggers. The second input terminal (e.g., BOR_EVT) of the logic gate 330 is coupled to the output terminal (e.g., BOR_EVT) of the logic gate 348. The output terminal of the logic gate 330 is coupled to a first input of the logic gate 332. In some examples, the logic gate 330 may have additional inputs to trigger a force POR. As further described below, the logic gate 330 performs a logic OR function to output a logic high value when the first input is a logic high and/or the second input is a logic high. If both inputs correspond to a logic low value, the logic gate 330 outputs a logic low value.

The logic gate 332 is a logic AND gate. The logic gate 332 includes two input terminals and an output terminal. The first input terminal of the logic gate 332 is coupled to the output terminal of the logic gate 330. The second input terminal of the logic gate 332 is coupled to the output terminal of the flip-flop 322. The output terminal of the logic gate 332 is coupled to the input terminal of the flip-flop 334. As further described below, the logic gate 332 performs a logic AND function to output a logic high value when the first input is a logic high and the second input is a logic high. Otherwise, the logic gate 332 outputs a logic low value.

The flip-flop 334 is a state flip-flop and/or D flip-flop. The flip-flop 334 includes two asynchronous input terminals and an output terminal. The first input terminal (e.g., PRE terminal) of the flip-flop 334 is coupled to the output of the logic gate 332. The second input terminal (e.g., CLR terminal) of the flip-flop 334 is coupled to the output terminal (e.g., Q and/or PORCE_POR) of the output terminal of the logic gate 336. The output terminal of the flip-flop 334 is coupled to the second input of the logic gate 300. As further described below, the flip-flop 334 is a clockless flip-flop that stores and outputs the logic value obtained via the PRE input terminal and outputs the stored value until a trigger is received via the CLR input terminal.

The example logic gate 336 is a logic AND gate. The logic gate 336 includes two input terminals and an output terminal. The first input terminal of the logic gate 336 is coupled to the output terminal of the POR circuitry 200 and the first input of the logic AND gate 300. The second input terminal of the logic gate 336 is coupled to the first output terminal (REF_EN_DLY) of the BG circuitry 202. The output terminal of the logic gate 336 is coupled to the second input terminal (e.g., CLR terminal) of the flip-flop 334. As further described below, the logic gate 336 performs a logic AND function to output a logic high value when the first input is a logic high and the second input is a logic high. Otherwise, the logic gate 336 outputs a logic low value.

The SD circuitry 212 includes the example logic gates 338, 340, 342 and an example flip-flop 334. The SD circuitry 212 facilitates a shutdown protocol, as further described below. The logic gate 338 is a logic AND gate 338. The logic gate 338 includes two input terminals and an output terminal. The first input terminal is coupled to the output terminal of the flip-flop 322. The second input terminal (e.g., SD_REQ) of the logic gate 338 is coupled to the system control SD circuitry 210 of FIG. 2. The output terminal of the logic gate 338 is coupled to an input terminal of the flip-flop 344. As further described below, the logic gate 338 performs a logic AND function to output a logic high value when the first input is a logic high and the second input is a logic high. Otherwise, the logic gate 338 outputs a logic low value.

The logic gate 340 is a logic AND gate. The logic gate 340 includes two input terminals and an output terminal. The first input terminal (e.g., REF_EN_DLY) is coupled to the second output terminal of the BG circuitry 202. The first input terminal is an inverted input terminal, where the value at the first input is inverted (e.g., from a logic high value to a logic low value or a low value to a high value). Alternatively, the first input terminal may not be inverted and a not gate or an inverter may be coupled in between the first input of the logic gate 340 and the second output terminal of the BG circuitry 202. The second input terminal (e.g., IO_WAKE) of the logic gate 340 is coupled to an IO of the IC 100. The output terminal of the logic gate 340 is coupled to the first input terminal of the logic gate 342. As further described below, the logic gate 340 performs a logic AND function to output a logic high value when the first input is a logic low (which is inverted to a logic high via the inverted terminal) and the second input is a logic high. Otherwise, the logic gate 340 outputs a logic low value.

The logic gate 342 is a logic AND gate. The logic gate 342 includes two input terminals and an output terminal. The first input terminal is coupled to the output terminal of the logic gate 340. The first input terminal is an inverted input terminal, where the value at the first input is inverted (e.g., from a logic high value to a logic low value or a low value to a high value). Alternatively, the first input terminal may not be inverted and a not gate or an inverter may be coupled in between the first input of the logic gate 342 and the output terminal logic gate 342. The second input terminal (e.g., SUP_RSTN_POR) of the logic gate 342 is coupled to the output terminal of the logic gate 300, the second input terminal of the logic gate 302, and the PO digital circuitry 216. The output terminal of the logic gate 342 is coupled to the second input terminal of the flip-flop 344. As further described below, the logic gate 342 performs a logic AND function to output a logic high value when the first input is a logic low (which is inverted to a logic high via the inverted terminal) and the second input is a logic high. Otherwise, the logic gate 342 outputs a logic low value.

The flip-flop 344 is a state flip-flop and/or D flip-flop. The flip-flop 344 includes two asynchronous input terminals and an output terminal. The first input terminal (e.g., PRE terminal) of the flip-flop 344 is coupled to the output of the logic gate 338. The second input terminal (e.g., CLR terminal) of the flip-flop 344 is coupled to the output terminal of the output terminal of the logic gate 342. The output terminal (e.g., Q) of the flip-flop 344 is coupled to the first input of the logic gate 302. As further described below, the flip-flop 344 is a clockless flip-flop that stores and outputs the logic value obtained via the PRE input terminal and outputs the stored value until a trigger is received via the CLR input terminal.

The comparator 346 includes an input terminal and an output terminal. The input terminal of the comparator 346 is coupled to a voltage source providing a threshold voltage and the second input terminal of the BOR circuitry 204. The output terminal of the comparator 346 is coupled to the first input terminal of the logic gate 348. As further described below, the comparator 346 outputs a logic high value when the voltage source is equal to 0V. Otherwise, the comparator 346 outputs a logic low value.

The logic gate 348 is a logic AND gate. The logic gate 348 includes two input terminals and an output terminal. The first input terminal is coupled to the output terminal of the comparator 346. The second input terminal of the logic gate 348 is coupled to the output terminal of the BOR circuitry 204, the second input terminal of the logic gate 308, and the second input terminal of the logic gate 312. The second input terminal is an inverted input terminal, where the value at the second input is inverted (e.g., from a logic high value to a logic low value or a low value to a high value). Alternatively, the second input terminal may not be inverted and a not gate or an inverter may be coupled in between the second input of the logic gate 348 and the output terminal of the BOR circuitry 204. The output terminal of the logic gate 348 is coupled to the second input terminal of the logic gate 330. As further described below, the logic gate 348 performs a logic AND function to output a logic high value when the first input is a logic high and the second input is a logic low (which is inverted to a logic high via the inverted terminal). Otherwise, the logic gate 348 outputs a logic low value.

In operation, the POR circuitry 200 of FIGS. 3A and 3B outputs a logic low value when the supply voltage (e.g., obtained via the supply voltage terminal 112) is below a first threshold voltage (e.g., 1V) and outputs a logic high value when the supply voltage is above the first threshold voltage. For example, during startup, after a supply voltage increases above a threshold voltage (e.g., 1 V), the POR circuitry 200 outputs a logic high value (e.g., 1 V). When the POR circuitry 200 outputs a logic high value (e.g., 1 V) and the outputs of the SD circuitry 212 and the force POR circuitry 214 correspond to a logic low value (e.g., 0 V), the input signal at the second input terminal of the BG circuitry 202 with be a logic high value. When the supply voltage is below the voltage threshold, the POR circuitry 200 outputs a low logic value (e.g., 0 V). Accordingly, when the supply voltage is below the voltage threshold, the logic gates 300, 302 will also output a logic low value (e.g., the logic AND of low and any other value is low). In this manner, the rest of the circuitry 202, 204, 206A, 206B, 208 will remain disabled.

The analog sub component 220 of the BG circuitry 202 determines when the supply voltage (e.g., obtained via the supply voltage terminal 112) is above a second threshold (e.g., 1.3 V) and the voltage at the second input terminal corresponds to a logic high value for more than a threshold amount of time. In some examples, the BG circuitry 202 includes a bandgap voltage generator to provide a reference voltage at or near the second threshold, and the analog sub component 220 may compare the supply voltage from terminal 112 against the reference voltage from the bandgap voltage generator, as further described below in conjunction with FIG. 4. Accordingly, the output of the BG circuitry 202 will correspond to a logic low value until (a) the supply voltage is above the second threshold (b) the input voltage corresponds to a logic high value and (c) the input voltage has corresponded to the logic high value for a threshold amount of time. Thus, so long as there is not a spike and/or drop in the supply voltage, it will take Z microseconds before the BG circuitry 202 outputs a logic high after obtaining a logic high value from the POR circuitry 200. The user and/or manufacturer can adjust the delay to balance speed and accuracy, the shorter the delay the increased likelihood that an error may occur resulting in reset.

After the BG circuitry 202 outputs the logic high value, the BOR circuitry 204 will obtain the logic high value (e.g., via the logic gates 304, 306). As further described below, the analog sub component 220 of the BOR circuitry 204 determines when the supply voltage (e.g., obtained via the supply voltage terminal 112) is above a third threshold (e.g., 1.5 V) and the voltage at the second input terminal corresponds to a logic high value for more than a threshold amount of time, as further described below in conjunction with FIG. 4. The third voltage threshold may be generated by a voltage generator that is obtained via the Vth input terminal of the BOR 204. The analog sub component 220 may compare the supply voltage from terminal 112 against the third voltage threshold from the Vth input terminal. Accordingly, the output of the BOR circuitry 204 will correspond to a logic low value until (a) the supply voltage is above the third threshold (b) the input voltage corresponds to a logic high value and (c) the input voltage has corresponded to the logic high value for a threshold amount of time. Thus, so long as there is not a spike and/or drop in the supply voltage, it will take X microseconds before the BOR circuitry 204 outputs a logic high after obtaining a logic high value from the BG circuitry 202. The user and/or manufacturer can adjust the delay to balance speed and accuracy, the shorter the delay the increased likelihood that an error may occur resulting in reset.

After the BOR 204 outputs the logic high value, the regulators 206A, 206B will obtain the logic high value. When the regulator 206B obtains a high logic value at the second input terminal of the regulator 206B, the regulator 206B regulates the supply voltage from the supply voltage terminal 112 to a predefined output voltage (VCORE) at the output terminal 114 (e.g., the VCORE terminal). After the regulator 206B regulates the supply voltage to the predefined output voltage, the regulator 206B outputs a logic high value to the logic gate 314. As described above, the voltage output by the regulator 206B powers the MCU 102.

As long as the coldboot protocol has not finished, the logic gate 308 will output a logic high value to the regulator comparator 206A when the output of the BOR circuitry 204 is a logic high value. Additionally, the logic gate 312 will output a logic high value whenever the BOR circuitry 204 outputs a logic high value. When the regulator comparator 206A obtains a high logic value at the second input terminal of the regulator 206A, the analog sub component 220 of the regulator comparator 206A determines when the output voltage (e.g., VCORE, obtained via the output voltage terminal 114) is stable at the intended output voltage (e.g., 1.35 V) and the voltage at the second input terminal corresponds to a logic high value for more than a threshold amount of time, as further described below in conjunction with FIG. 4. As described above, it will take some time for the regulated output voltage (VCORE) generated by the regulator 206A to reach the intended value due to the time it takes to charge the external capacitor coupled to the output voltage terminal 114. The output of the regulator comparator 206A will correspond to a logic low value until (a) the regulated output voltage (e.g., VCORE) is stable (b) the input voltage corresponds to a logic high value and (c) the input voltage has corresponded to the logic high value for a threshold amount of time. Thus, so long as there is not a spike and/or drop in the regulated output voltage (VCORE), it will take Y microseconds before the regulator comparator 206A outputs a logic high after obtaining a logic high value from the BOR circuitry 204. The user and/or manufacturer can adjust the delay to balance speed and accuracy, the shorter the delay the increased likelihood that an error may occur resulting in reset.

The logic gate 316 outputs a high logic value when the output of the regulators 206A, 206B are both a high voltage. Accordingly, after the regulators 206A, 206B determine that the supply voltage and/or output voltage is an acceptable voltage, a logic high value will be stored in the example flip-flop 318. The flip-flop 318 outputs the stored high logic value at the output terminal (Q) until the clear input terminal of the 318 obtains a logic value low to reset the flip-flop to output a logic low value. The output of the flip-flip 318 controls the clock generator 208. Thus, when the flip-flop 318 changes from a logic low value to a logic high value (e.g., after the regulators 206A, 206B output a logic high value), the clock generator 208 is enabled and the oscillator of the clock begins to generate voltage pulses. The clock generator 208 includes one or more flip-flops structured to output a logic high value when after a threshold amount of time and/or after a threshold number of pulses (e.g., for the oscillator to stabilize to a predefined frequency).

After the clock generator 208 outputs the logic high value on the ultralow leakage (ULL) coldboot done connection and while the output of the flip-flop 318 outputs a logic high value, the logic gate 320 outputs a logic high value to the input terminal of the example flip-flop 322. The high logic value is stored in the flip-flop 322 and output via the output terminal (Q). The output of the high logic value indicates that the startup process or coldboot is complete and that the output voltage (VCORE) is sufficient to power the components of the IC 100 without causing damage and/or errors.

If at any point during the startup and/or coldboot process any one of the analog sub components 220 determines that the corresponding threshold voltage is not satisfied, the output of the sub component(s) 220 will go to a low logic value and disable all subsequent components, which may result in a shutdown and/or power on reset. The flip-flops 318, 322 store the state so that the BOR circuitry 204 can be used for other modes outside of the startup and/or coldboot process. For example, the BOR circuitry 204 can enter into a temped mode and/or a low power mode without having the output of the BOR circuitry 204 affect the operation of the regulators 206A, 206B and/or the clock generator 208. The flip-flop 318 holds the high logic state from the BOR circuitry 204 while the BOR circuitry 204 is used for other purposes until the flip-flop 318 is cleared based on the output of the logic gate 302.

The SD circuitry 212 facilitates a shutdown process of the BG circuitry 202, the BOR circuitry 204, the regulators 206A, 206B. When the control SD circuitry 210 outputs a signal to perform a shutdown process, the logic gate 338 outputs a logic high value so long as the coldboot process has already completed (e.g., corresponding to a logic high value at the output of the flip-flop 322). The logic high value from the logic gate 228 is output to the input terminal of the flip-flop 344, causing the flip-flop 334 to store the logic high value. When the second output of the BG circuitry 202 is a low logic value and the logic value from the IO is a high value, the logic gate 340 outputs a logic high value. The second output of the BG circuitry 202 corresponds to a delayed enable signal. For example, when the logic value at the input terminal of the BG gate 202 switches from low to high or from high to low, the second output of the BG circuitry 202 will switch in the same manner after a threshold amount of time corresponding to a predefined delay. If the logic value at the first input terminal is high and/or the logic value at the second input terminal is low, the logic gate 340 will output a low logic value.

When the output of the logic gate 340 is low and the output of the logic gate 300 is high, the logic gate 342 will output a logic value high. When the output of the logic gate 340 is high and/or the output of the logic gate 300 is low, the logic gate 342 will output a logic value low. The logic gate 342 outputs the logic value to the second input terminal (e.g., the CLR input terminal) of the flip-flop 344. If the logic gate 342 outputs a high logic value, the flip-flop 344 clears the stored state to output a logic low value to the first input of the logic gate 302. If the logic value at the first input terminal of the logic gate 302 is a low logic value, the logic gate 302 allow the POR circuitry 200 to enable the BG circuitry 202, the BOR circuitry 204, the regulators 206A, 206B, and/or the clock generator 208 and/or allow the POR circuitry 200 to keep the BG circuitry 202, the BOR circuitry 204, the regulators 206A, 206B, and/or the clock generator 208 enabled. In this manner, the SD circuitry 210 can initiate a shutdown of the BG circuitry 202, the BOR circuitry 204, the regulators 206A, 206B, and/or the clock generator 208 and the IO can transmit a signal to wake the components up after a shutdown. Although the SD circuitry 212 can trigger a shutdown of components of the IC 100, the PO digital circuitry 216 continue to remain powered by the POR circuitry 200 as the SD circuitry 212 does not shutdown the POR circuitry 200.

The force POR circuitry 214 facilitates a forced power on reset of the BG circuitry 202, the BOR circuitry 204, the regulators 206A, 206B. When any one of the inputs of the logic gate 330 goes to a high logic signal, the logic gate 330 outputs a logic high value to the logic gate 332. If all of the inputs of the logic gate 330 correspond to a low logic signal, the logic gate 330 outputs a logic low value to the logic gate 332. The inputs correspond to a software-based POR (e.g., from the MCU 102), a BOR event (e.g., further described below) from the logic gate 348, and/or based on another trigger (e.g., a parity error on the PMU trim data). The logic high value from the logic gate 330 is output to the first input terminal of the logic gate 332. The logic gate 332 outputs a logic high value when the output of the logic gate 332 is a high logic value and the output of the flip-flop 322 is high (e.g., corresponding to a complete coldboot process). The logic gate 332 outputting a high logic value causes the flip-flop 334 to store the logic high value and output the logic high value to the second input terminal of the logic gate 300.

A high logic value at the second input terminal of the logic gate 300 causes the logic gate 300 to output a low logic value, thereby shutting down and/or disabling the BG circuitry 202, the BOR circuitry 204, the regulators 206A, 206B, and/or the clock generator 208. As described above, the BG circuitry 202 outputs a signal at the second output terminal (e.g., REF_EN_DLY) that corresponds to the signal at the input terminal delayed by a threshold amount of time. Accordingly, after a threshold amount of time after the logic value at the input terminal of the BG circuitry 202 goes to a low logic value, the BG circuitry 202 will output a low logic signal into the second input terminal of the logic gate 336. A low logic signal at the second terminal of the logic gate 336 causes the logic gate 336 to output a low logic value to the input terminal (e.g., CLR terminal) of the flip-flop 334, cause the flip-flop 334 to reset the output back to the low logic value. Accordingly, the force POR circuitry 214 performs the force power on reset process by temporarily disabling the BG circuitry 202, the BOR circuitry 204, the regulators 206A, 206B and/or the clock generator 208 and then restarting the enable, boot, and/or startup process again.

As described above a BOR event can trigger a force POR. The example comparator 346 and the logic gate 348 triggers a BOR event with a high logic value at the output terminal of the logic gate 348, which is input to the logic gate 330. The logic gate 348 will output a logic high value when the first input (e.g., the output of the comparator 346) is a high logic value and the second input (e.g., the output of the BOR circuitry 204) is a low logic value. The comparator 346 outputs a high logic value when the threshold voltage is equal to 0 V (e.g., corresponding to a brown out).

Figure 4:
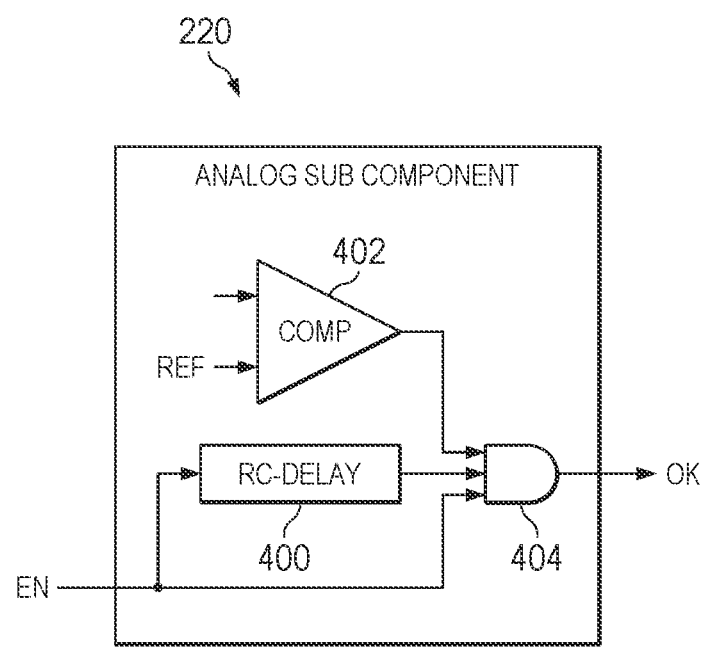
FIG. 4 is a circuit diagram of an example analog sub-component of FIGS. 3A and 3B.

FIG. 4 is a circuit diagram of the example analog sub component 220 (e.g., also referred to as a voltage measurement circuit) of FIGS. 2 and/or 3. The example analog sub component 220 includes an example comparator 402, an example delay circuitry 400, and an example logic gate 404. The example analog sub component 220 may be implemented in any of the BG circuitry 202, the BOR circuitry 204, and/or the regulator(s) 206, 206A, 206B of FIGS. 2 and/or 3. The input terminal (EN) of the analog sub component 220 corresponds to the input terminal of the implementing device (e.g., the BG circuitry 202, the BOR circuitry 204, and/or the regulator(s) 206, 206A, 206B and the output terminal (OK) of the analog sub component 220 corresponds to the output terminal of the implementing device.

The delay circuitry 400 of FIG. 4 is a resistor capacitor delay circuit. However, the delay circuitry 400 can be any type of delay circuit. The delay circuitry 400 includes an input terminal and an output terminal. The input terminal is coupled to the input terminal of the implementing circuitry. For example, the analog sub component 220 of the BG circuitry 202 is coupled to the input terminal (e.g., the EN terminal) of the BG circuitry 202, the analog sub component 220 of the BOR circuitry 204 is coupled to the input terminal (e.g., the EN terminal) of the BOR circuitry 204, the analog sub component 220 of the regulator 206 is coupled to the input terminal (e.g., the EN terminal) of the regulator 206, and the analog sub component 220 of the regulator comparator 206A is coupled to the input terminal (e.g., the EN terminal) of the regulator 206A. The output terminal of the delay circuitry 400 is coupled to a second input terminal of the logic gate 404. When the analog sub component 220 is implemented in the BG circuitry 202, the output terminal of the delay circuitry 400 may also be coupled to the first output terminal (e.g., REF_EN_DLY) of the BG circuitry 202.

The example comparator circuitry 402 includes two input terminals and an output terminal. The first input terminal of the comparator 402 is coupled to the supply voltage terminal 112 and/or the output voltage terminal (Vcore) 114. For example, when the analog sub component 220 is implemented in the BG circuitry 202, the BOR circuitry 204, the regulator 206, the first input terminal is coupled to the supply voltage terminal 112. When the analog sub component 220 is implemented in the regulator 206 and/or the regulator 206A, the first input terminal is coupled to the output voltage terminal 114. The second input terminal is coupled to a reference voltage (e.g., a voltage source that outputs a reference voltage). The reference voltage may be a different voltage depending on which component is implementing the analog sub component 220. For example, the reference voltage for the BG circuitry 202 may be 1 V, the reference voltage for the BOR circuitry may be 1.3 V, and the reference voltage for the regulator 206, 206A may be 1.35 V. If the analog sub component 220 is implemented by the BOR circuitry 204, the second input is coupled to the second input (Vth) of the BOR circuitry 204. Thus, the comparator circuitry 402 may produce a logic high signal at the output terminal when the voltage at the first input terminal (e.g., the supply voltage) is greater than or equal to the voltage at the second input terminal (e.g., the reference voltage) and otherwise produce a logic low signal at the output terminal. The output terminal of the comparator 402 is coupled to the first input terminal of the logic gate 404.

The logic gate 404 is a logic AND gate. The logic gate 404 includes three input terminals and an output terminal. The first input terminal of the logic gate 404 is coupled to the output terminal of the comparator 402. The second input terminal of the logic gate 404 is coupled to the output terminal of the delay circuitry 400. The third input terminal of the logic gate 404 is coupled to the input terminal (e.g., the EN terminal) of the implementing circuitry. The output terminal of the logic gate 404 is coupled to the output terminal (E.g., OK terminal) of the implementing circuitry.

Initially, at power up, the logic value at the input terminal (EN terminal) will be a logic low value. However, after power up, if the logic value at the input terminal changes from a low logic value to a high logic value, the logic value at the third input terminal of the logic gate 404 will be high. Additionally, the delay circuitry 400 will also change from a logic low value to a logic high value a threshold amount of time after the input terminal changed from logic low to logic high. The threshold amount of time is based on the configuration of the delay circuitry 400 and can be configured based on user and/or manufacturer preferences.

The comparator 402 compares the voltage at the supply voltage terminal 112 and/or the output voltage terminal 114 to the reference voltage. As explained above, if the voltage at the supply voltage terminal 112 and/or the output voltage terminal 114 is lower than the reference voltage, the comparator 402 outputs a logic low value. If the voltage at the supply voltage terminal and/or the output voltage terminal 114 is higher than the reference voltage, the comparator outputs a logic high value.

The logic gate 404 outputs a logic high value if the voltage at all three input terminals correspond to a logic high value. Otherwise, the logic gate 404 outputs a logic low value. Accordingly, when the input terminal changes from a logic low to a logic high, the logic gate 404 will not output a logic high until (A) the delay circuitry has changed to a logic high after a threshold amount of time and (B) the comparator 402 determines that the voltage at the supply voltage terminal 112 and/or the output voltage terminal 114 is higher than the reference voltage. If any one of the input terminals drops to a low voltage, the logic gate 404 will change to a logic low output.

Figure 5:
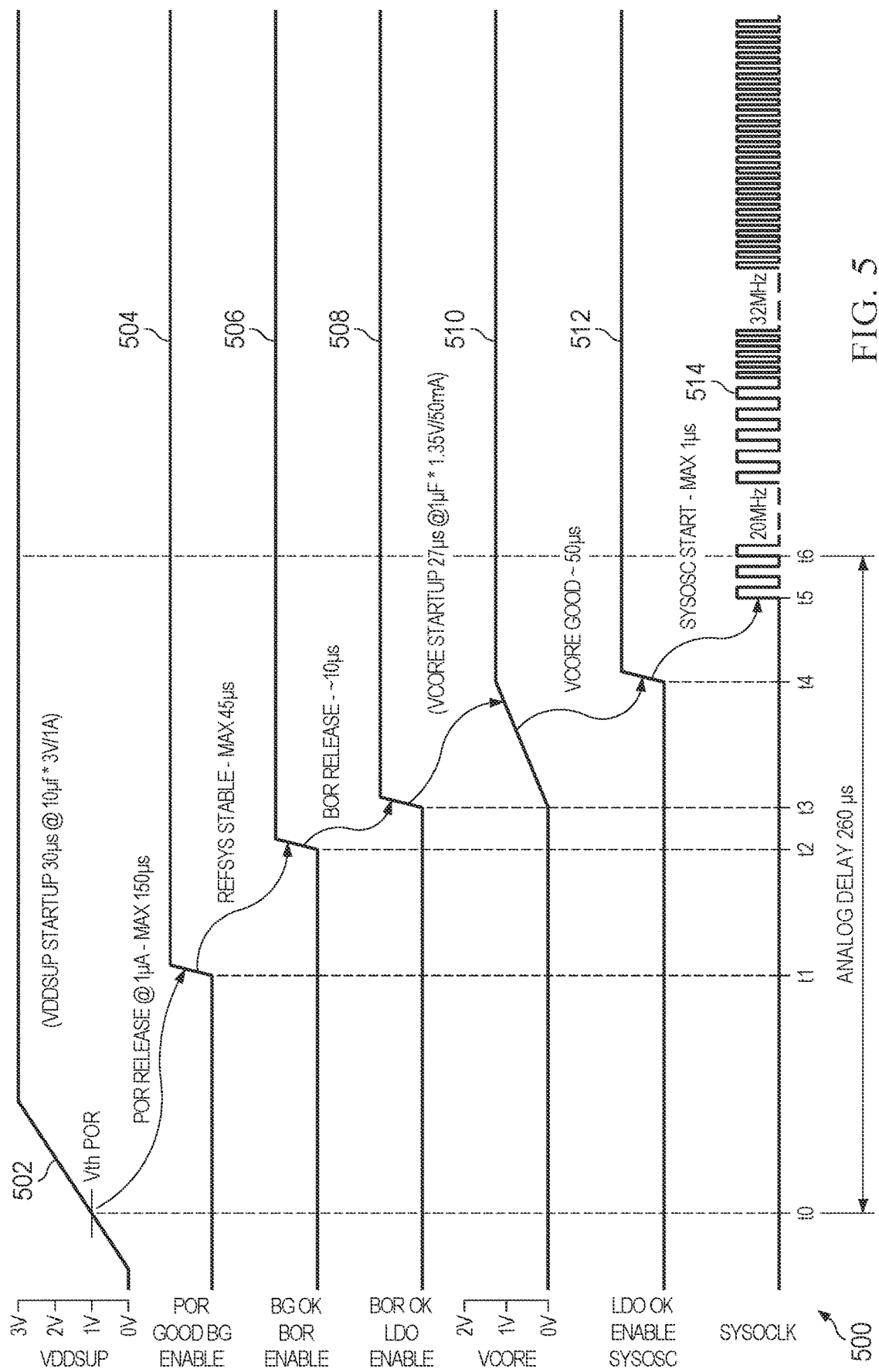
FIG. 5 is a timing diagram corresponding to examples disclosed herein.

FIG. 5 is an example timing diagram 500 of a startup of the IC 100. The example timing diagram 500 of FIG. 5 includes voltages 502, 504, 506, 508, 510, 512, 514 corresponding to different nodes of the example startup circuitry 110 of FIGS. 3A and 3B. However, the timing diagram 500 can be described in conjunction with the startup circuitry 110 of FIG. 2 and/or any other startup circuitry. The first example voltage 502 corresponds to the voltage at the input voltage obtained at the supply voltage terminal 112 of FIGS. 3A and 3B. The second example voltage 504 corresponds to the voltage at the output terminal (e.g., POR_N) of the example POR circuitry 200 and the input terminal (e.g., EN) of the BG circuitry 202. The third example voltage 506 corresponds to the voltage at the output terminal (e.g., OK) of the BG circuitry 202 and the input terminal (EN) of the BOR circuitry 204. The fourth example voltage 508 corresponds to the voltage at the output terminal (e.g., OK) of the BOR circuitry 204 and the input terminal of the regulator 206, 206A, 206B. The fifth example voltage 510 corresponds to the output voltage at the output voltage terminal 114. The sixth example voltage 512 corresponds to the voltage at the output of the regulator 206, 206A and the input terminal (e.g., ULL_RSTN_ALL) of the clock generator 208. The seventh example voltage 514 corresponds to an output signal of the example clock generator 208.

At time t0, after a supply voltage is obtained via the supply voltage terminal 112, the first voltage 502 increases from 0 V to 3 V. At time t1, the POR circuitry 200 determines that the voltage 502 is above a first threshold voltage and increases the output from a low logic value to a high logic value, as shown in the second voltage 504. At time t2, the BG circuitry 202 determines that the voltage 502 is above a second threshold voltage. As described above, the BG circuitry 202 includes the analog sub component 220 to increase the voltage 506 from a logic low to a logic high when the first voltage 502 is above the second threshold and after a threshold amount of time (e.g., corresponding to the delay circuitry 400) after the second voltage 504 goes from a logic low to a logic high.

At time t3, the BOR circuitry 204 determines that the voltage 502 is above a third threshold voltage. As described above, the BOR circuitry 204 includes the analog sub component 220 to increase the voltage 508 from a logic low to a logic high when the first voltage 502 is above the third threshold and after a threshold amount of time (e.g., corresponding to the delay circuitry 400) after the third voltage 506 goes from a logic low to a logic high. Additionally at time t3, because the output of the BOR circuitry 204 raises to a logic high, the regulator 206 begins to regulate the voltage 502 to a regulated voltage 510, which corresponds to the output voltage (Vcore) terminal 114.

At time t4, after the voltage 510 is above a fourth threshold, the regulator(s) 206, 206A raises from a logic low to a logic high. As described above, the regulator(s) 206, 206A includes the analog sub component 220 to increase the voltage 512 from a logic low to a logic high when the fifth voltage 510 is above the fourth threshold and after a threshold amount of time (e.g., corresponding to the delay circuitry 400) after the fourth voltage 508 goes from a logic low to a logic high. After the output of the regulator(s) 206, 206A go from a logic low to a logic high, the flip-flop 318 stores and outputs the logic high value to the input terminal of the clock generator 208. A logic high value at the input terminal of the clock generator 208 initiates the generation of a clock signal, as shown in the seventh signal 514 at time t5. At time t6, after a threshold number of pulses from the clock generator 208, the boot process is complete, corresponding to a total of 260 microsecond of delay without the use of a clock to generate the delay. If, at any point during the boot process (e.g., times t0-t6), the supply voltage generates a peak or drop, the one or more of the voltages 504-514 will decrease back to a logic low and the process will restart (e.g., from where the peak/drop was identified) to avoid operating the clock generator 208 outside of a predefined voltage range, thereby avoiding inaccuracies of the clock generator 208.

Figure 6:
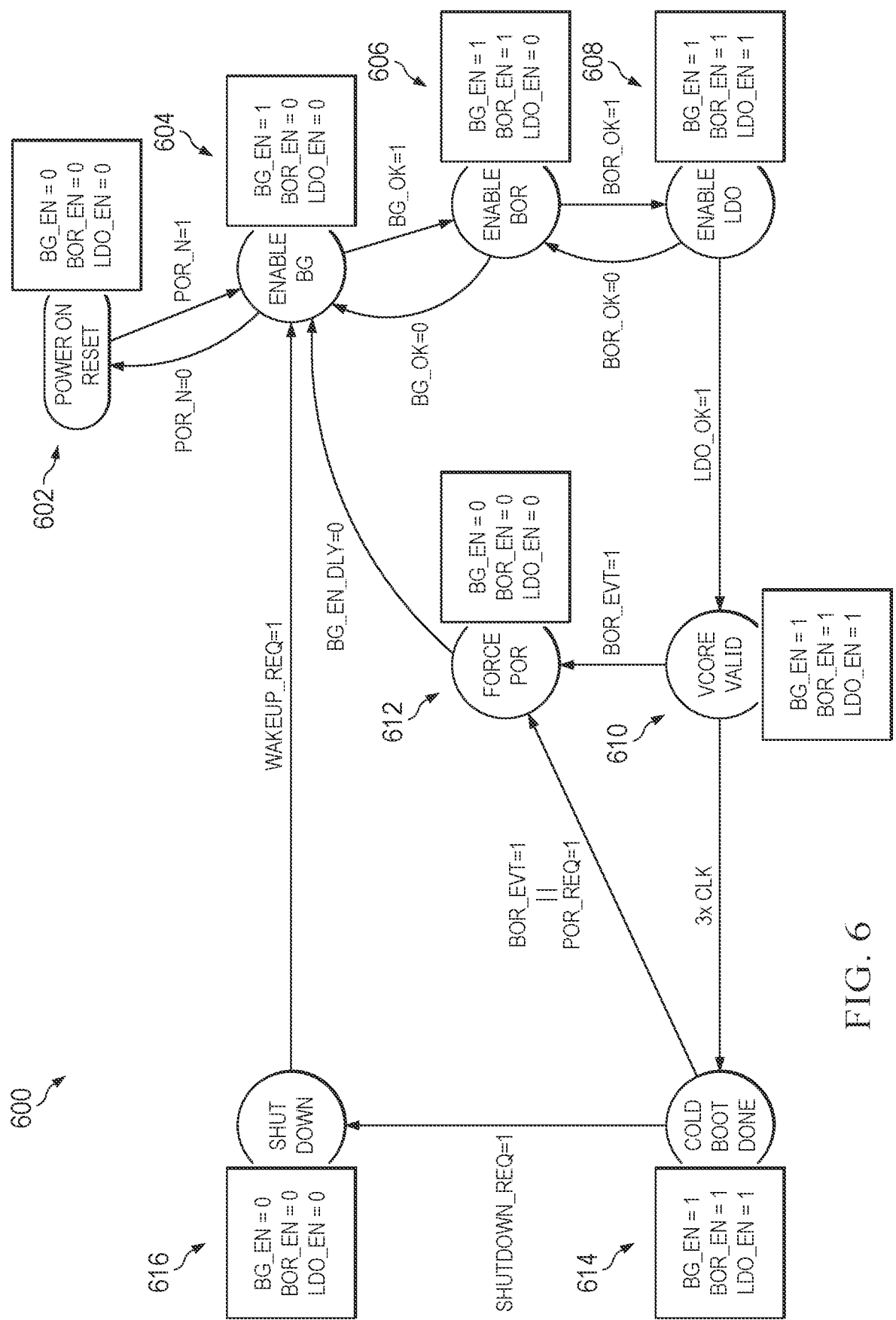
FIG. 6 is an example state diagram corresponding to operation of the example startup circuitry of FIGS. 1-3.

FIG. 6 is an example state diagram 600 corresponding to the startup circuitry 110 of FIGS. 3A and 3B. However, the state diagram 600 can be described in conjunction with the startup circuitry 110 of FIG. 2 and/or any other startup circuitry. The state diagram 600 includes example states 602, 604, 606, 608, 610, 612, 614, 616 connected by transition conditions.

The first state 602 is a power on reset state. The power on reset state is the first state during initiation of the IC 100. During the power on reset state, the output terminal (POR_N) of the POR circuitry 200 is a logic low value (e.g., 0), the output terminal (e.g., EN) of the BG circuitry 202 is a logic low value, the output terminal (e.g., EN) of the BOR circuitry 204 is a logic low value, and the output terminal (e.g., EN) of the regulator(s) 206, 206A, 206B is/are a logic low value. If the output terminal of the POR circuitry (e.g., the POR_N terminal) changes to a logic high value (e.g., '1'), the first state 602 transitions to the second state 604.

The second state 604 is an enable the BG circuitry 202 state. During the second state 604, the input terminal (EN) of the BG circuitry 202 corresponds to a high logic value because the output of the POR circuitry 200 is a high logic value. Additionally, the output terminals (EN) of the BOR circuitry 204 and the regulator(s) 206, 206 (*a*), 206 (*b*) are logic low values. If, while in the second state 604, the output of the POR circuitry 200 (e.g., the POR_N terminal) decreases to a logic low value, the second state 604 will return to the first state 602. When the BG circuitry 202 outputs a logic high value (e.g., at the OK terminal of the BG circuitry 202), the second state 604 transitions to the third state 606.

The third state 606 is an enable the BOR circuitry 204 state. During the third state 606, the input terminal (EN) of the BOR circuitry 204, and the input terminal (EN) of the BG circuitry 202 are a high logic values. Additionally, the output terminal(s) (EN) of the regulator(s) 206, 206(*a*), 206(*b*) are logic low values. If, while in the third state 606, the output of the BG circuitry 202 (e.g., the BG_OK terminal) decreases to a logic low value, the third state 606 will return to the second state 604. When the BOR circuitry 204 outputs a logic high value (e.g., at the OK terminal of the BOR circuitry 204), the third state 606 transitions to the fourth state 608.

The fourth state 608 is an enable the regulator(s) 206, 206A, 206B state. During the fourth state 608, the input terminal (EN) of the BOR circuitry 204, the input terminal (EN) of the BG circuitry 202, and input terminal (EN) the regulator(s) 206, 206A, 206B are high logic values. If, while in the fourth state 608, the output of the BOR circuitry 204 (e.g., the BOR_OK terminal) decreases to a logic low value, the fourth state 608 will return to the third state 608. When the regulator(s) 206, 206A, 206B outputs a logic high value (e.g., at the OK terminal of the regulator(s) 206, 206A, 206B), the fourth state 608 transitions to the fifth state 610.

The fifth state 610 is a Vcore valid state (e.g., when the Vcore output voltage is substantially stable at a predefined voltage). The Vcore valid state corresponds to when the flip-flop 318 of FIGS. 3A and 3B outputs a logic high value, thereby enabling the clock generator 208. During the firth state 610, the input terminal (EN) of the BOR circuitry 204, the input terminal (EN) of the BG circuitry 202, and input terminal (EN) the regulator(s) 206, 206A, 206B are high logic values. If, while in the fifth state 610, a BOR event occurs (e.g., the logic gate 348 outputs a logic high value), the fifth state 610 will enter the sixth state 612. If, while in the fifth state 610, the clock signal pulses three times, the clock generator 208 will output a logic high value causing the example logic gate 320 and the flip-flop 322 to output a logic high value corresponding to the seventh state 714.

The sixth state 612 is a force POR state. The force POR state corresponds to a power on reset of the startup circuitry 110. During the sixth state 612, the input terminal (EN) of the BOR circuitry 204, the input terminal (EN) of the BG circuitry 202, and input terminal (EN) the regulator(s) 206, 206A, 206B are low logic values. If, while in the sixth state 612, the delayed enable output of the BG circuitry 202 (e.g., the BG_EN_DLY terminal) changes to a logic low value, the sixth state 612 returns to the second state 604.

The seventh state 614 is a cold boot done state. The cold boot done state indicates that the output voltage from the regulator(s) 206, 206A, 206B and the clock generator 208 are ready for utilization. During the seventh state 614, the input terminal (EN) of the BOR circuitry 204, the input terminal (EN) of the BG circuitry 202, and input terminal (EN) the regulator(s) 206, 206A, 206B are high logic values. If, while in the seventh state 614, the delayed enable output of the BG circuitry 202 (e.g., the BG_EN_DLY terminal)

changes to a logic low value or a POR request is obtained from the MCU 102, the seventh state 614 returns to the sixth state 612. If, while in the seventh state 614, a shutdown request is obtained from the control SD circuitry 210, the seventh state 614 enters into the eighth state 616.

The eight state 616 is a shutdown state. The shutdown state corresponds to disabling portions of the startup circuitry 110. During the eighth state 618, the input terminal (EN) of the BOR circuitry 204, the input terminal (EN) of the BG circuitry 202, and input terminal (EN) the regulator(s) 206, 206A, 206B are low logic values. If, while in the eighth state 616, a wakeup request is obtained (e.g. via an IO), the eighth state 616 returns to the second state 604.

In this description, the term "and/or" (when used in a form such as A, B and/or C) refers to any combination or subset of A, B, C, such as: (a) A alone: (b) B alone: (c) C alone; (d) A with B; (e) A with C; (f) B with C; and (g) A with B and with C. Also, as used herein, the phrase "at least one of A or B" (or "at least one of A and B") refers to implementations including any of: (a) at least one A: (b) at least one B; and (c) at least one A and at least one B.

Example methods, apparatus and articles of manufacture described herein improve shared pins in ICs by facilitating the use of the share pin as analog or digital in regular mode, DFT mode, and/or boundary scan mode while reducing and/or eliminating leakage current during the boundary scan and/or avoiding damage to an input buffer during the DFT mode.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

Numerical identifiers such as "first", "second", "third", etc. are used merely to distinguish between elements of substantially the same type in terms of structure and/or function. These identifiers, as used in the detailed description, do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate: (ii) incorporated in a single semiconductor package: (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

Example methods, apparatus, systems, and articles of manufacture to facilitate safe startup of a power management unit are disclosed herein. Further examples and combinations thereof include the following: Example 1 includes an integrated circuit comprising a clock, processor circuitry to utilize the clock after a boot protocol is complete, and power management circuitry including a first analog circuit including an output terminal, the first analog circuit to, after a supply voltage is above a first threshold, output a first logic value at the output terminal of the first analog circuit, a second analog circuit including an input terminal and an output terminal, the second analog circuit to, after (a) a first voltage at the input terminal of the second analog circuit corresponds to the first logic value and (b) the supply voltage is above a second threshold, output the first logic value to the output terminal of the second analog circuit, and a voltage regulator including an input terminal, a first output terminal, and a second output terminal, the voltage regulator to regulate the supply voltage to a second voltage, and after (a) a third voltage at the input terminal of the voltage regulator corresponds to the first logic value and (b) the second voltage is above a third threshold, enable the clock, the boot protocol to be complete after the clock is enabled.

Example 2 includes the integrated circuit of example 1, wherein the second analog circuit is to output the first logic value at the output terminal of the second analog circuit when the first voltage at the input terminal of the second analog circuit corresponds to the first logic value for more than a threshold amount of time.

Example 3 includes the integrated circuit of example 1, wherein the boot protocol is complete after a threshold number of pulses from the clock.

Example 4 includes the integrated circuit of example 1, further including force power-on reset circuitry to reset the first analog circuit based on an error corresponding to the second analog circuit.

Example 5 includes the integrated circuit of example 1, further including shutdown circuitry to disable the first analog circuit, the second analog circuit, the voltage regulator, and the clock in response to a request.

Example 6 includes the integrated circuit of example 1, wherein the first analog circuit includes an input terminal, further including a third analog circuit to output the first logic value to the input terminal of the first analog circuit after the supply voltage is above a fourth threshold, the first analog circuit to output the first logic value at the output terminal of the first analog circuit after a fourth voltage at the input terminal of the first analog circuit corresponds to the first logic value.

Example 7 includes the integrated circuit of example 1, wherein the processor circuitry is powered using the second voltage.

Example 8 includes the integrated circuit of example 1, further including a flip-flop to hold an output of the voltage regulator, the output to enable the clock.

Example 9 includes an integrated circuit comprising first analog circuitry including an input terminal and an output terminal, second analog circuitry including delay circuitry including an input terminal and an output terminal, the input terminal coupled to the output terminal of the first analog circuitry, a logic gate including a first input terminal, a second input terminal, a third input terminal, and an output terminal, the first input terminal of the logic gate coupled to the output terminal of the first analog circuitry, the second input terminal coupled to the output terminal of the delay circuitry, and a comparator including a first input terminal, a second input terminal, and an output terminal, the first input terminal of the comparator coupled to a supply voltage terminal, the second input terminal of the comparator coupled to a reference voltage terminal, and the output terminal of the comparator coupled to the third input terminal of the logic gate, a regulator including an input terminal and an output terminal, the input terminal of the regulator coupled to the output terminal of the logic gate, and a clock including an input terminal coupled to the output terminal of the regulator.

Example 10 includes the integrated circuit of example 9, wherein the logic gate is a first logic gate, further including a second logic gate and a third logic gate, wherein the input terminal of the delay circuitry and the first input terminal of the first logic gate is coupled to the first analog circuitry via the second logic gate, and the output terminal of the first logic gate is coupled to regulator via the third logic gate.

Example 11 includes the integrated circuit of example 9, wherein the logic gate is a first logic gate, further including a flip-flop, and a second logic gate, the input terminal of the clock coupled to the output terminal of the regulator via the flip-flop and the second logic gate.

Example 12 includes the integrated circuit of example 11, wherein the flip-flop includes an input terminal and an output terminal, the input terminal of the flip-flop coupled to the output terminal of the regulator, and the second logic gate includes an input terminal and an output terminal, the input terminal of the first logic gate coupled to the output terminal of the flip-flop, the output terminal of the first logic gate coupled to the input terminal of the clock.

Example 13 includes the integrated circuit of example 12, wherein the first logic gate is an AND gate and the second logic gate is a NOT gate.

Example 14 includes the integrated circuit of example 12, wherein the output terminal of the flip-flop is coupled to the input terminal of the delay circuitry and the first input terminal of the first logic gate.

Example 15 includes an apparatus comprising an input terminal, an output terminal, a delay circuit including an input terminal and an output terminal, the input terminal coupled of the delay circuit coupled to the input terminal, a comparator including a first input terminal, a second input terminal, and an output terminal, the first input terminal of the comparator coupled to a supply voltage terminal, the second input terminal of the comparator coupled to a reference voltage terminal, and a logic AND gate including a first input terminal, a second input terminal, a third input terminal, and an output terminal, the first input terminal of the logic AND gate coupled to the output terminal of the comparator, the second input terminal of the logic AND gate coupled to the output terminal of the delay circuit, the third input terminal of the logic AND gate coupled to the input terminal, and the output terminal of the logic AND gate coupled to the output terminal.

Example 16 includes the apparatus of example 15, further including a first logic gate and a second logic gate, the input terminal coupled to the first logic gate and the output terminal coupled to the second logic gate.

Example 17 includes the apparatus of example 16, further including a voltage regulator including an input terminal and an output terminal, the input terminal of the voltage regulator coupled to the output terminal.

Example 18 includes the apparatus of example 17, further including a flip-flop, the output terminal of the voltage regulator coupled to the input terminal via the flip-flop and the first logic gate.

Example 19 includes the apparatus of example 18, further including an oscillator coupled to the flip-flop.

Example 20 includes the apparatus of example 16, wherein the logic AND gate is a first logic AND gate, wherein the first logic gate is at least one of a second logic AND gate or a logic OR gate.

What is claimed is:

1. An integrated circuit comprising:
   a clock generator;
   processor circuitry to utilize the clock generator after a boot protocol is complete; and
   power management circuitry including:
   a first voltage measurement circuit including an output terminal, the first voltage measurement circuit to, after a supply voltage is above a first threshold, output a first logic value at the output terminal of the first voltage measurement circuit;
   a second voltage measurement circuit including an input terminal and an output terminal, the second voltage measurement circuit to, after a first voltage at the input terminal of the second voltage measurement circuit corresponds to the first logic value and the supply voltage is above a second threshold, output the first logic value to the output terminal of the second voltage measurement circuit; and a voltage regulator including an input terminal, a first output terminal, and a second output terminal, the voltage regulator to regulate the supply voltage to produce a second voltage; and a third voltage measurement circuit to, after a third voltage at the input terminal of the voltage regulator corresponds to the first logic value and the second voltage is above a third threshold, enable the clock generator, the boot protocol to be complete after the clock generator is enabled.

2. The integrated circuit of claim 1, wherein the second voltage measurement circuit is to output the first logic value at the output terminal of the second voltage measurement circuit when the first voltage at the input terminal of the second voltage measurement circuit corresponds to the first logic value for more than a threshold amount of time.

3. The integrated circuit of claim 1, wherein the boot protocol is complete after a threshold number of pulses from the clock generator.

4. The integrated circuit of claim 1, further including force power-on reset circuitry to reset the first voltage measurement circuit based on an error corresponding to the second voltage measurement circuit.

5. The integrated circuit of claim 1, further including shutdown circuitry to disable the first voltage measurement circuit, the second voltage measurement circuit, the voltage regulator, and the clock generator in response to a request.

6. The integrated circuit of claim 1, wherein the first voltage measurement circuit includes an input terminal, further including a fourth voltage measurement circuit to output the first logic value to the input terminal of the first voltage measurement circuit after the supply voltage is above a fourth threshold, the first voltage measurement circuit to output the first logic value at the output terminal of the first voltage measurement circuit after a fourth voltage at the input terminal of the first voltage measurement circuit corresponds to the first logic value.

7. The integrated circuit of claim 1, wherein the processor circuitry is powered using the second voltage.

8. The integrated circuit of claim 1, further including a flip-flop to hold an output of the voltage regulator, the output to enable the clock generator.

9. An integrated circuit comprising:
first voltage measurement circuitry including an input terminal and an output terminal;
second voltage measurement circuitry including:
  delay circuitry including an input terminal and an output terminal, the input terminal coupled to the output terminal of the first voltage measurement circuitry;
  a logic gate including a first input terminal, a second input terminal, a third input terminal, and an output terminal, the first input terminal of the logic gate coupled to the output terminal of the first voltage measurement circuitry, the second input terminal coupled to the output terminal of the delay circuitry; and
  a comparator including a first input terminal, a second input terminal, and an output terminal, the first input terminal of the comparator coupled to a supply voltage terminal, the second input terminal of the comparator coupled to a reference voltage terminal, and the output terminal of the comparator coupled to the third input terminal of the logic gate;
a regulator including an input terminal and an output terminal, the input terminal of the regulator coupled to the output terminal of the logic gate; and
a clock generator including an input terminal coupled to the output terminal of the regulator.

10. The integrated circuit of claim 9, wherein the logic gate is a first logic gate, further including a second logic gate and a third logic gate, wherein:
the input terminal of the delay circuitry and the first input terminal of the first logic gate is coupled to the first voltage measurement circuitry via the second logic gate; and
the output terminal of the first logic gate is coupled to regulator via the third logic gate.

11. The integrated circuit of claim 9, wherein the logic gate is a first logic gate, further including:
a flip-flop; and
a second logic gate, the input terminal of the clock generator coupled to the output terminal of the regulator via the flip-flop and the second logic gate.

12. The integrated circuit of claim 11, wherein:
the flip-flop includes an input terminal and an output terminal, the input terminal of the flip-flop coupled to the output terminal of the regulator; and
the second logic gate includes an input terminal and an output terminal, the input terminal of the first logic gate coupled to the output terminal of the flip-flop, the output terminal of the first logic gate coupled to the input terminal of the clock generator.

13. The integrated circuit of claim 12, wherein the first logic gate is an AND gate and the second logic gate is a NOT gate.

14. The integrated circuit of claim 12, wherein the output terminal of the flip-flop is coupled to the input terminal of the delay circuitry and the first input terminal of the first logic gate.

15. An apparatus comprising:
an input terminal;
an output terminal;
a delay circuit including an input terminal and an output terminal, the input terminal coupled of the delay circuit coupled to the input terminal;
a comparator including a first input terminal, a second input terminal, and an output terminal, the first input terminal of the comparator coupled to a supply voltage terminal, the second input terminal of the comparator coupled to a reference voltage terminal; and
a logic AND gate including a first input terminal, a second input terminal, a third input terminal, and an output terminal, the first input terminal of the logic AND gate coupled to the output terminal of the comparator, the second input terminal of the logic AND gate coupled to the output terminal of the delay circuit, the third input terminal of the logic AND gate coupled to the input terminal, and the output terminal of the logic AND gate coupled to the output terminal.

16. The apparatus of claim 15, further including a first logic gate and a second logic gate, the input terminal coupled to the first logic gate and the output terminal coupled to the second logic gate.

17. The apparatus of claim 16, further including a voltage regulator including an input terminal and an output terminal, the input terminal of the voltage regulator coupled to the output terminal.

18. The apparatus of claim 17, further including a flip-flop, the output terminal of the voltage regulator coupled to the input terminal via the flip-flop and the first logic gate.

19. The apparatus of claim 18, further including an oscillator coupled to the flip-flop.

20. The apparatus of claim 16, wherein the logic AND gate is a first logic AND gate, wherein the first logic gate is at least one of a second logic AND gate or a logic OR gate.

\* \* \* \* \*